(12) United States Patent
Nozu

(10) Patent No.: US 9,082,847 B2
(45) Date of Patent: Jul. 14, 2015

(54) TRENCH MISFET

(71) Applicant: Kabushiki Kaisha Toshiba, Minato-ku, Tokyo (JP)

(72) Inventor: Tetsuro Nozu, Tokyo (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/203,314

(22) Filed: Mar. 10, 2014

(65) Prior Publication Data

US 2015/0069504 A1 Mar. 12, 2015

(30) Foreign Application Priority Data

Sep. 11, 2013 (JP) ................... 2013-188480

(51) Int. Cl.
*H01L 29/00* (2006.01)
*H01L 29/78* (2006.01)
*H01L 29/66* (2006.01)
*H01L 29/423* (2006.01)

(52) U.S. Cl.
CPC ........ *H01L 29/7827* (2013.01); *H01L 29/4236* (2013.01); *H01L 29/42368* (2013.01); *H01L 29/66666* (2013.01); *H01L 29/66734* (2013.01)

(58) Field of Classification Search
CPC ..................... H01L 29/66734; H01L 29/4236; H01L 29/42368; H01L 29/66666
See application file for complete search history.

(56) References Cited

U.S. PATENT DOCUMENTS

| | | |
|---|---|---|
| 5,581,100 A | 12/1996 | Ajit |
| 6,930,352 B2 | 8/2005 | Saito et al. |
| 7,230,297 B2 | 6/2007 | Ono et al. |
| 2014/0239386 A1* | 8/2014 | Zeng et al. ..................... 257/330 |
| 2014/0252461 A1* | 9/2014 | Kang et al. ..................... 257/330 |
| 2014/0284711 A1* | 9/2014 | Katoh et al. .................. 257/331 |
| 2015/0035051 A1* | 2/2015 | Hebert .......................... 257/334 |

FOREIGN PATENT DOCUMENTS

| | | |
|---|---|---|
| JP | 2004-311716 A | 11/2004 |
| JP | 2005-354037 A | 12/2005 |
| JP | 2012-238769 | 6/2012 |

OTHER PUBLICATIONS

B.J. Baliga et al. "The Accumulation-Mode Field-Effect Transistors: A new Ultralow On-Resistance MOSFET", IEEE, EDL, vol. 13, pp. 427-429 (1992).

* cited by examiner

*Primary Examiner* — Ngan Ngo
(74) *Attorney, Agent, or Firm* — White & Case LLP

(57) ABSTRACT

This device includes a first semiconductor layer of the first conduction-type. A second semiconductor layer of the first conduction-type is provided above the first semiconductor layer. Gate electrodes respectively have one end located at the second semiconductor layer and other end located at the first semiconductor layer. The gate electrodes extend at a first direction. Gate dielectric films are provided between the first semiconductor layer and the gate electrodes. A plurality of first insulating films are provided between the second semiconductor layer and the gate electrodes and are thicker than the gate dielectric films. A first electrode is provided at a shallower position than the other end between adjacent ones of the gate electrodes and contacts the first and the second semiconductor layer and the first insulating films. A second electrode is provided at an opposite side of the first layer against to the second semiconductor layer.

20 Claims, 9 Drawing Sheets

TRENCH MISFET

CROSS REFERENCE TO RELATED APPLICATIONS

This application is based upon and claims the benefit of priority from the prior Japanese Patent Application No. 2013-188480, filed on Sep. 11, 2013, the entire contents of which are incorporated herein by reference.

FIELD

The embodiments of the present invention relate to a semiconductor device.

BACKGROUND

Requirements of downscaling, a low ON-state resistance, and a high breakdown voltage are increasingly imposed on a MOSFET (Metal-Oxide Semiconductor Field Effect Transistor) so as to meet recent demands of high-efficiency and energy-saving techniques. With a view to satisfy the low resistance requirement among those requirements, a trench MOSFET at a high channel density is widely used. In a normal (normally-off) trench MOSFET, a semiconductor layer of a conduction type opposite to that of a source layer or a drift layer (a drain layer) is used as a base layer. By applying a gate voltage to such a normally-off trench MOSFET, a region of the base layer that faces a gate electrode is brought into an inversion state and a highly concentrated carrier region ("channel layer") is formed. A low resistance device is thereby realized.

There is also known an accumulation mode FET as a lower resistance device. The accumulation mode FET does not include the base layer of the opposite conduction type but a base layer is formed of a low-concentration semiconductor of the same conduction type. In the accumulation mode FET, an OFF-state (in a case of the normally-off MOSFET) is realized by depleting the base layer even without any gate voltage. In an ON-state, carriers are induced to this base layer in an accumulation mode by applying a gate voltage to the accumulation mode FET, thereby realizing a low resistance device. Generally, in a case of forming an inversion layer and a conductive channel in the MOSFET, carriers in the channel (hereinafter, "channel carriers") are confined in a very narrow region on the surface of the base layer. Because this region acts as an interface with a gate oxide film, the channel carriers are scattered by charges in the gate oxide film or on the interface and by interface non-uniformity (interface roughness). It is known that channel carrier mobility is accordingly lower than bulk mobility. In contrast, the accumulation mode FET is less affected by the reduction in the mobility caused by the interface because the channel carriers spread over a relatively wide region in the base layer (a low-concentration drift layer). Therefore, it is possible to form a high-mobility channel layer in the accumulation mode FET, thereby realizing the low resistance device. Furthermore, an impurity concentration of the base layer used in the accumulation mode FET is lower than that of the base layer used in the general MOSFET. Accordingly, an influence of impurity scattering on the accumulation mode FET is small and the low resistance device can be realized.

However, the accumulation mode FET is inferior in a breakdown voltage. In a case of an N-accumulation mode FET, holes generated on the bottom of each trench by impact ionization are normally emitted toward a source electrode. However, because the accumulation mode FET does not include so-called "carrier-emission electrodes (P-contacts)", a base-source potential is slightly decreased so as to emit a large amount of generated holes. At this time, a large amount of electrons flow from the source electrode to the base layer. This increases a source-drain current and the accumulation mode FET shows current-voltage characteristics similar to those in a bipolar operation. As a result, it is disadvantageously difficult to ensure a high breakdown voltage. As described above, the problem with a conventional accumulation mode FET is that it is difficult to realize a low resistance device having a high breakdown voltage.

DETAILED DESCRIPTION

Embodiments will now be explained with reference to the accompanying drawings. The present invention is not limited to the embodiments. In the following embodiments, a vertical direction of a semiconductor device indicates a relative direction for the sake of convenience and often differs from a vertical direction according to gravitational acceleration.

A semiconductor device according to an embodiment includes a first semiconductor layer of the first conduction-type. A second semiconductor layer of the first conduction-type is provided above the first semiconductor layer. Gate electrodes respectively have one end located at the second semiconductor layer and other end located at the first semiconductor layer. The gate electrodes extend at a first direction. Gate dielectric films are provided between the first semiconductor layer and the gate electrodes. A plurality of first insulating films are provided between the second semiconductor layer and the gate electrodes and are thicker than the gate dielectric films. A first electrode is provided at a shallower position than the other end between adjacent ones of the gate electrodes and contacts the first and the second semiconductor layer and the first insulating films. A second electrode is provided at an opposite side of the first layer against to the second semiconductor layer.

(First Embodiment)

Figure 1:
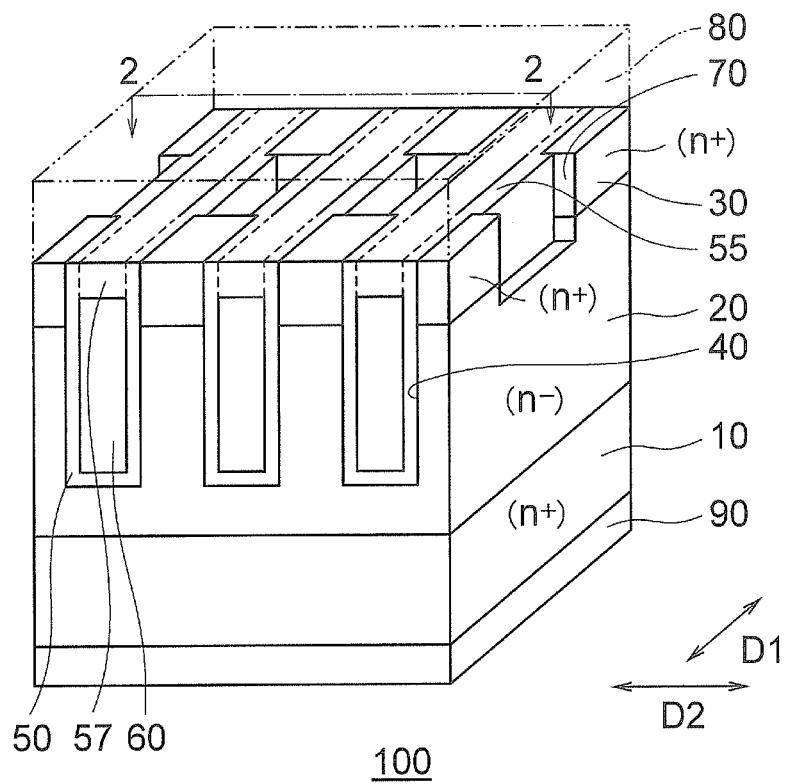
FIG. 1 is a perspective view showing an example of a configuration of a trench MISFET 100 according to a first embodiment.
Figure 2:
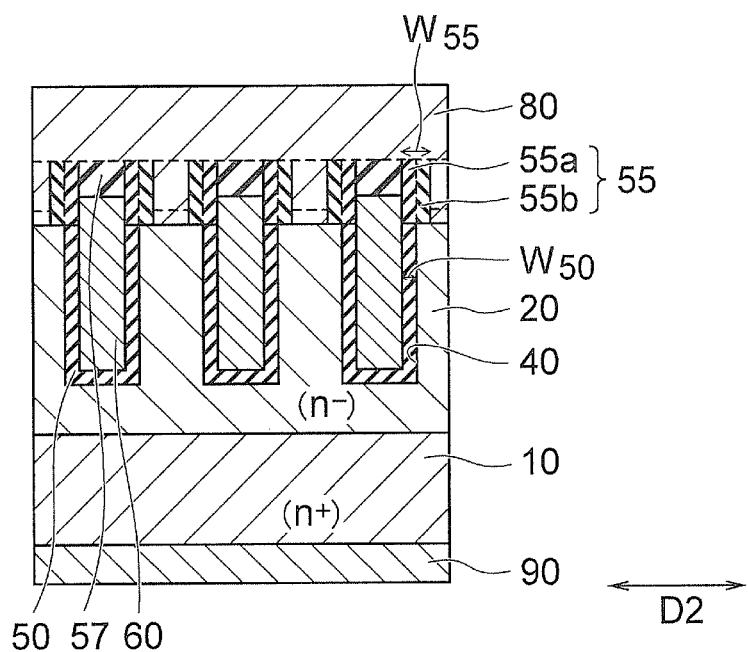
FIG. 2 is a cross-sectional view taken along a line 2-2 of FIG. 1.

FIG. 1 is a perspective view showing an example of a configuration of a trench MISFET (Metal-Insulator Semiconductor FET) 100 (hereinafter, also simply "transistor 100") according to a first embodiment. FIG. 2 is a cross-sectional view taken along a line 2-2 of FIG. 1.

The transistor 100 includes an n+-semiconductor substrate 10, an n−-drift layer 20 serving as a first semiconductor layer, an n+-source layer 30 serving as a second semiconductor layer, gate dielectric films 50, sidewall insulating films 55 serving as first insulating films, gate electrodes 60, source electrodes 80, and a drain electrode 90.

For example, the semiconductor substrate 10 is a silicon substrate and contains n-impurities of a relatively high concentration.

The n−-drift layer 20 is provided on the semiconductor substrate 10. For example, the n−-drift layer 20 is formed by using epitaxially grown silicon crystals. The n−-drift layer 20 has a lower n-impurity concentration than those of the semiconductor substrate 10 and the source layer 30.

The n+-source layer 30 is provided on an opposite side of the n−-drift layer 20 to the semiconductor substrate 10. For example, the n+-source layer 30 is formed by using epitaxially grown silicon crystals. The n+-source layer 30 contains n-impurities of a relatively high concentration similarly to the semiconductor substrate 10.

A plurality of first trenches 40 are provided to extend in a direction D1 from a surface of the source layer 30 to deep positions halfway in the drift layer 20. The first trenches 40 are arrayed in a second direction D2 almost orthogonal to the direction D1. The gate dielectric films 50 are provided along inner sides of the first trenches 40, respectively.

A plurality of gate electrodes 60 are provided in the first trenches 40 with the gate dielectric films 50 interposed therebetween, respectively. Therefore, the gate electrodes 60 extend in the direction D1 along the first trenches 40. For example, the gate electrodes 60 are formed by using doped polysilicon. The gate electrodes 60 and the first trenches 40 are formed up to somewhat deep positions in the drift layer 20. The gate electrodes 60 and the first trenches 40 do not reach the semiconductor substrate 10. The gate electrodes 60 adjacent in the direction D2 can be connected to each other in a region (not shown). It is thereby possible to control the gate electrodes 60 to be simultaneously turned on or off.

Second trenches 70 are provided between adjacent two of the first trenches 40, respectively. The second trenches 70 are provided from the surface of the source layer 30 to deep positions at which the second trenches 70 reach the drift layer 20. The second trenches 70 are provided to embed the source electrodes 80 therein and are shallower than the first trenches 40.

The sidewall insulating films 55 are provided along inner sides of the second trenches 70 on the gate electrode 60 side, respectively. The sidewall insulating films 55 are formed to be thicker than the gate dielectric films 50. A part of the sidewall insulating films 55 can be the gate dielectric films 50. For example, as shown in FIG. 2, each of the sidewall insulating films 55 can be formed of an insulating film 55$a$ serving as a first partial insulating film and formed simultaneously with the gate dielectric films 50, and an insulating film 55$b$ serving as a second partial insulating film and formed additionally to a side surface of the insulating film 55$a$. The sidewall insulating films 55 are formed so that a width W55 of each sidewall insulating film 55 is larger than a width W50 of each of the gate dielectric films 50 by as much as a width of the insulating film 55$b$. Furthermore, the insulating film 55$a$ is made of the same material as that of the gate dielectric films 50 whereas the insulating film 55$b$ is formed separately from the gate dielectric films 50. Therefore, the insulating film 55$b$ can be formed by using a low-dielectric-constant film (so-called "Low-k film") lower in a dielectric constant than the insulating film 55$a$.

The source electrodes 80 are provided on the source layer 30 and cap insulating films 57 and are embedded in the second trenches 70, respectively. The source electrodes 80 are provided in the second trenches 70 with the sidewall insulating films 55 interposed therebetween, respectively. For example, the source electrodes 80 are formed by using a metal such as Pt, W, Mo, Au or Al. These metals can be connected to the n+-source layer 30 having a high n-impurity concentration by an ohmic contact and connected to the n−-drift layer 20 having a low n-impurity concentration by a Schottky contact.

The second trenches 70 are provided in part of areas between adjacent ones of the first trenches 40 arranged in the direction D2, respectively. Therefore, the second trenches 70 are arrayed in the direction D2. Accordingly, the sidewall insulating films 55 are provided on lateral parts of the second trenches 70 on the gate electrode 60 side, respectively. The source electrodes 80 are filled in the second trenches 70 with the sidewall insulating films 55 interposed therebetween, respectively.

The drain electrode 90 is provided on an opposite side of the semiconductor substrate 10 to the drift layer 20.

Figure 3:
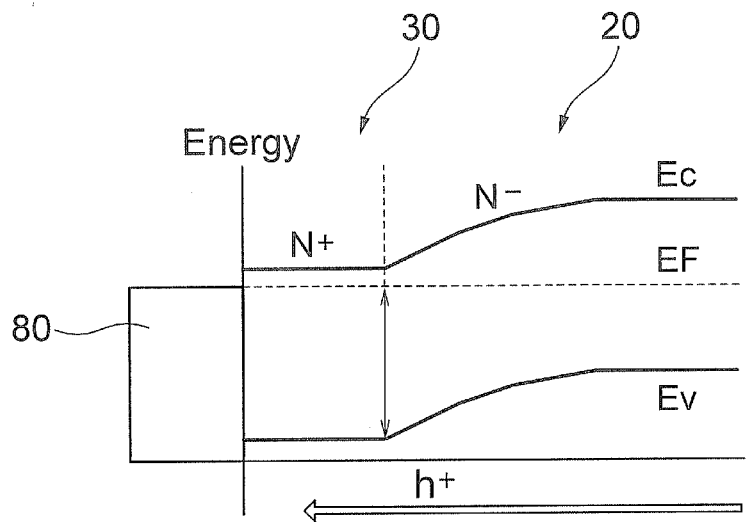
FIG. 3 is an energy band diagram showing the ohmic contact between one source electrode 80 and one source layer 30.
Figure 4:
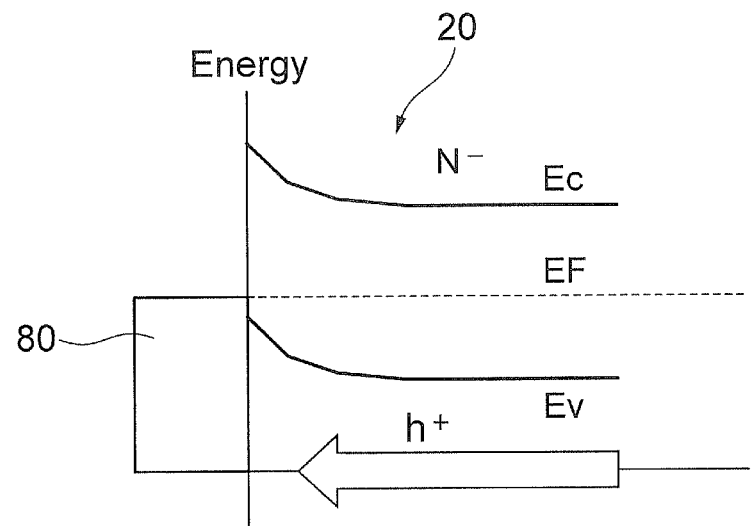
FIG. 4 is an energy band diagram showing the Schottky contact between one source electrode 80 and one drift layer 20.

The source electrodes 80 are connected to the source layer 30 by the ohmic contact and connected to the drift layer 20 by the Schottky contact. FIG. 3 is an energy band diagram showing the ohmic contact between one source electrode 80 and one source layer 30. FIG. 4 is an energy band diagram showing the Schottky contact between one source electrode 80 and one drift layer 20. In FIGS. 3 and 4, reference characters Ec, Ev, and EF indicate energy of a lower end of a conduction band, energy of an upper end of a valence band, and Fermi energy, respectively. As can be understood from FIG. 3, an electron current forms a conduction path with a device outside through the ohmic contact between the source layer 30 and the source electrode 80. The Schottky contact for electrons corresponds to the ohmic contact for holes. Therefore, as can be understood from FIG. 4, a hole current forms a conduction path through the Schottky contact (the ohmic contact for holes) between the drift layer 20 and the source electrode 8.

A case of applying a voltage equal to or lower than a breakdown voltage between a source and a drain of the transistor 100 is considered. In this case, avalanche breakdown, although it is weak, occurs in the drift layer 20 and electron-hole pairs are generated. By using a structure according to the first embodiment, the generated holes can be easily emitted from the source electrodes 80 and there is no possibility of a decrease in the breakdown voltage. On the other hand, the electrons flow in a direction of the drain electrode 90 similarly to a normal behavior and no problem occurs.

For the Schottky contact between the source electrode 80 and the drift layer 20, the source electrode 80 needs to be embedded to penetrate the source layer 30 and to reach the drift layer 20. In this case, a gate-source capacitance Cgs increases because the source electrode 80 is closer to the gate electrode 60. When the capacitance Cgs increases, it takes a long time to charge the gate electrode 60. This causes a reduction in a switching speed of the transistor 100.

Considering the above, the sidewall insulating films 55 are formed to be thicker than the gate dielectric films 50 in the first embodiment. By forming the sidewall insulating film 55 to be thicker, the sidewall insulating films 55 largely isolate the source electrodes 80 from the gate electrodes 60, respectively. This can reduce the gate-source capacitance Cgs. As a result, it is possible to suppress the reduction in the switching speed of the transistor 100.

Furthermore, the insulating films 55$a$ are made of the same material as that of the gate dielectric films 50 while the insulating films 55b are formed separately from the gate dielectric films 50. Therefore, the insulating films 55b can be formed using the low-dielectric-constant films (so-called "Low-k films"). The insulating films 55b can be porous Low-k films. It is thereby possible to further reduce the gate-source capacitance Cgs.

As described above, in the first embodiment, the source electrodes 80 are connected to the source layer 30 by the ohmic contact and connected to the drift layer 20 by the Schottky contact. The source electrodes 80 thereby function as carrier-emission trench electrodes. It is thereby possible to easily emit the holes generated in the drift layer 20 from the drift layer 20 to the source electrodes 80 and to improve the breakdown voltage.

Furthermore, the sidewall insulating films 55 are formed to be thicker, whereby a thickness of each of the insulating films between the gate electrodes 60 and the source electrodes 80 is set larger than that of each of the insulating films between the gate electrodes 60 and the drift layer 20 or the source layer 30. With this configuration, even if the source electrodes 80 are embedded in the respective second trenches 70 so as to connect the drift layer 20 to the source electrodes 80 by the Schottky contact, it is possible to suppress an increase in the gate-source capacitance Cgs. As a result, the reduction in the switching speed of the transistor 100 can be suppressed. Furthermore, by using the Low-k films for a part of the sidewall insulating films 55 (the insulating films 55b), it is possible to further suppress the increase in the capacitance Cgs. The transistor 100 functions as a power FET for large current switching. Not only a low ON-state resistance and a high breakdown voltage but also a high switching speed is an important characteristic of the power FET.

While the n-trench FET has been described in the above embodiment, the first embodiment is also applicable to a p-trench FET. In a case of the p-trench FET, the source electrodes 80 can be connected to the p-drift layer 20 by the Schottky contact by forming the source electrodes 80 using Sn, In or Ti, for example. Furthermore, while the holes of the generated electron-hole pairs have been mainly discussed in the first embodiment, it suffices to discuss the electrons in place of the holes in the case of the p-trench FET.

Figure 5A:
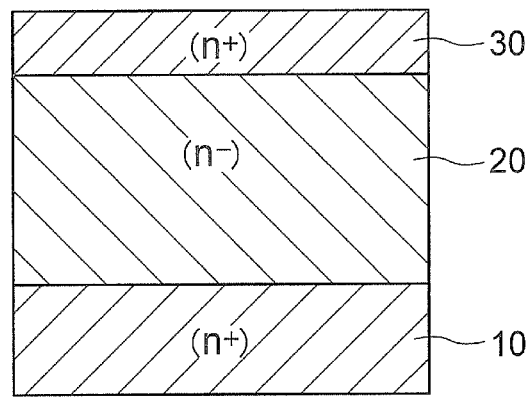
FIGS. 5A to 9 show an example of a manufacturing method of the transistor 100 according to the first embodiment.
Figure 5B:
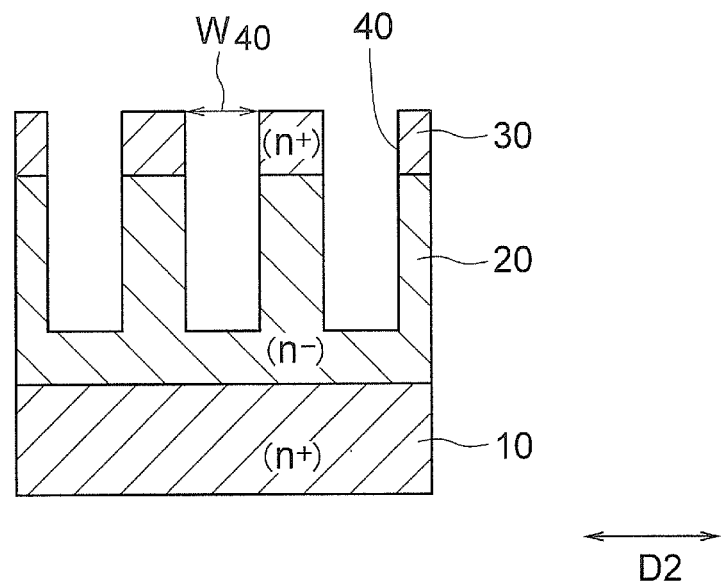
Figure 6A:
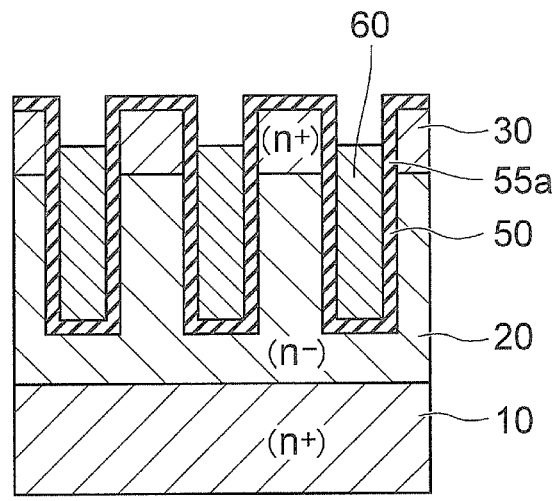
Figure 6B:
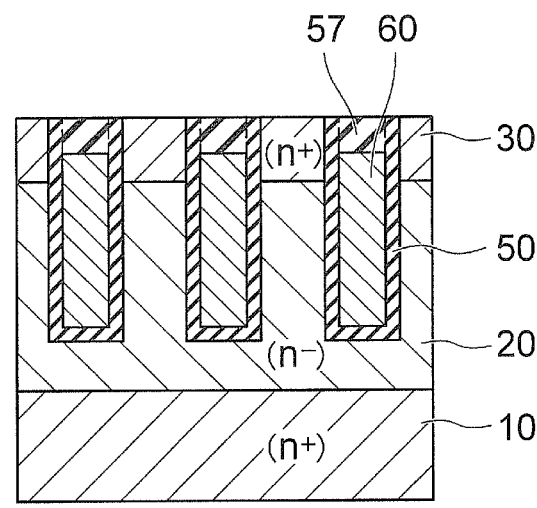
Figure 7:
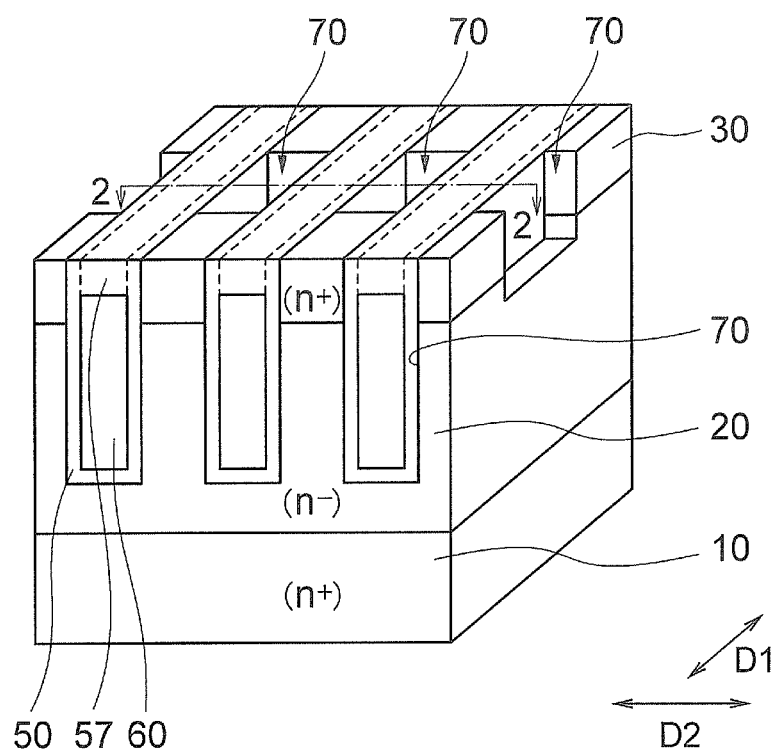
Figure 8A:
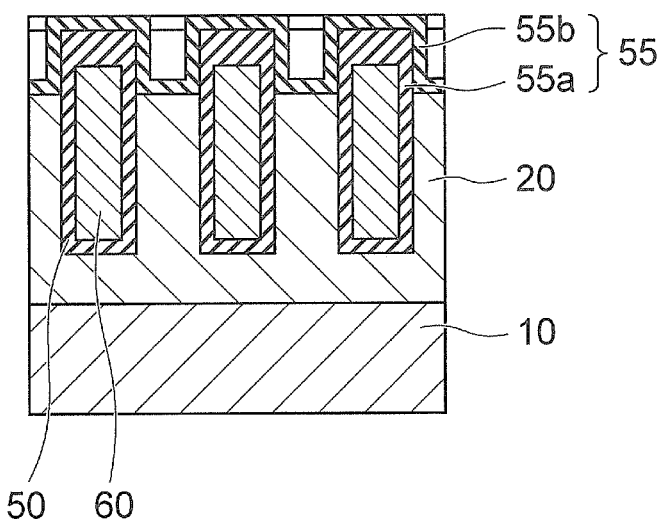
Figure 8B:
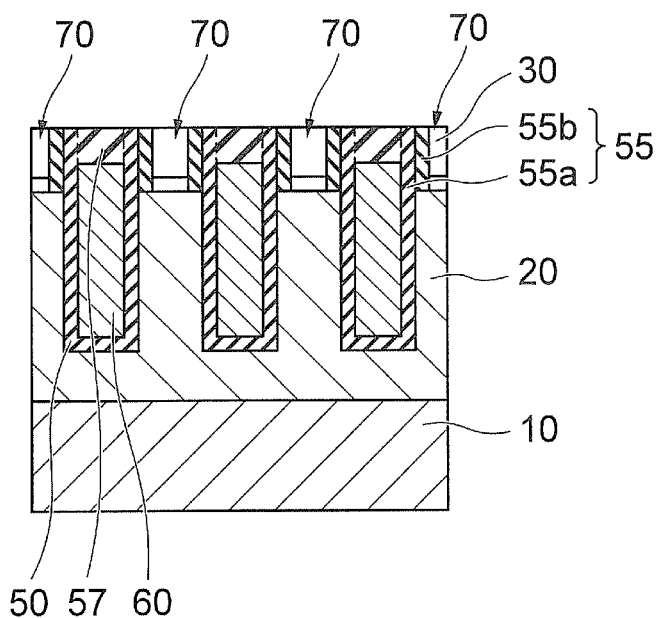
Figure 9:
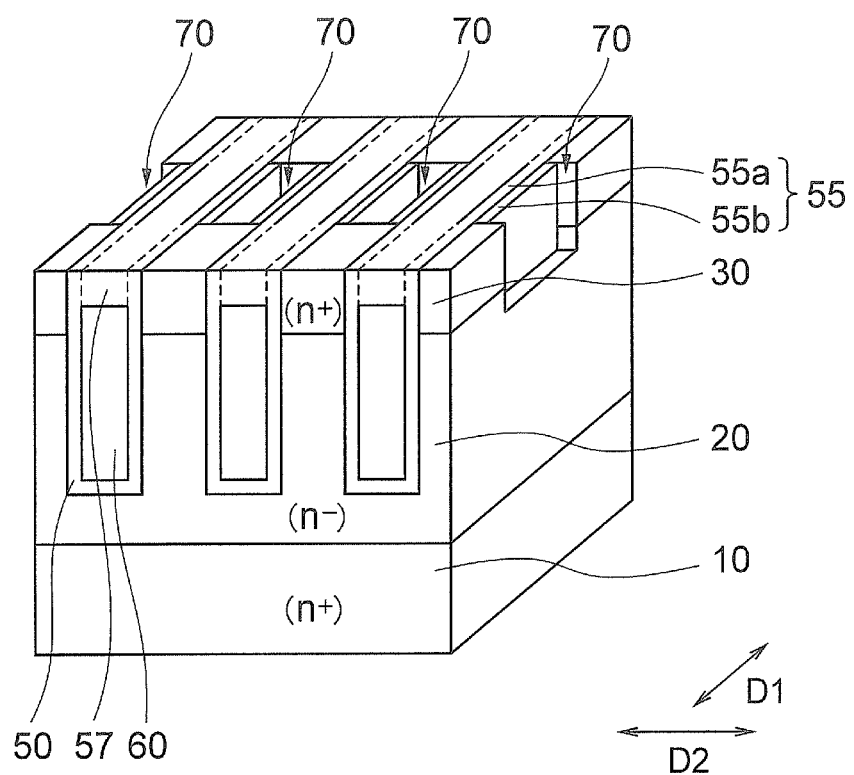

FIGS. 5A to 9 show an example of a manufacturing method of the transistor 100 according to the first embodiment. FIGS. 5A to 6B, 8A, and 8B are cross-sectional views and FIGS. 7 and 9 are perspective views.

First, as shown in FIG. 5A, the drift layer 20 and the source layer 30 are epitaxially grown on the semiconductor substrate 10. For example, the semiconductor substrate 10 is a silicon substrate containing arsenic at a concentration of about $2 \times 10^{19}$ cm$^{-3}$. For example, a thickness of the semiconductor substrate 10 is about 150 micrometers. For example, the drift layer 20 contains phosphorus at a concentration of about $1 \times 10^{14}$ cm$^{-3}$ to $1 \times 10^{16}$ cm$^{-3}$, and a thickness of the drift layer 20 is about 2 micrometers. For example, the source layer 30 contains phosphorus at a concentration of about $2 \times 10^{19}$ cm$^{-3}$ and a thickness of the source layer 30 is about 0.5 micrometer.

Next, as shown in FIG. 5B, the first trenches 40 are formed using a lithographic technique and an RIE (Reactive Ion Etching) method. For example, a depth of each of the first trenches 40 is about 1 to 2 micrometers, and an opening width W40 of the first trench 40 in the direction D2 is about 0.5 to 1 micrometer.

Using a thermal oxidation method, the gate dielectric films 50 are then formed along the inner sides of the first trenches 40, respectively. In this case, the gate dielectric films 50 are silicon oxide films. For example, a thickness of each of the gate dielectric films 50 is about 50 to 70 nanometers. At this time, the insulating films 55a are formed in portions of the inner sides of the first trenches 40 located in the source layer 30 as a part of the sidewall insulating films 55. Alternatively, the gate dielectric films 50 (and the insulating films 55a) can be formed using silicon nitride films or other high-dielectric-constant films. Next, a material of the gate electrodes 60 is deposited in the first trenches 40. For example, the material of the gate electrodes 60 is p$^+$-doped polysilicon. Using a CMP (Chemical Mechanical Polishing) method or a CDE (Chemical Dry Etching) method, the material of the gate electrodes 60 is then etched back. As shown in FIG. 6A, the gate electrodes 60 are thereby formed in the first trenches 40, respectively.

Next, using a CVD (Chemical Vapor Deposition) method, the cap insulating films 57 are deposited. Using the CMP method or the CDE method, the cap insulating films 57 and the gate dielectric films 50 are etched until an upper surface of the source layer 30 is exposed. A structure shown in FIG. 6B is thereby obtained.

Next, as shown in FIG. 7, the second trenches 70 are formed using the lithographic technique and the RIE method. At the time of forming the second trenches 70, a photoresist (not shown) including grooves extending in a direction intersecting with the first trenches 40 (the direction D2) is used. Using this photoresist as a mask, a part of the source layer 30 and a part of the drift layer 20 are selectively etched by the RIE method. As shown in FIG. 7, the second trenches 70 arrayed in the direction D2 are thereby formed. The second trenches 70 suffice to be deep enough to reach the drift layer 20 and to be thicker than the source layer 30 to some extent.

The cross-sectional views of FIGS. 8A, 8B, and 9 are those taken along a line 2-2 of FIG. 7.

Next, as shown in FIG. 8A, a material of the insulating films 55b that are parts of the sidewall insulating films 55 is deposited using the CVD method. For example, the material of the insulating films 55b is a silicon oxide film and a thickness of the material is about 100 nanometers. As described above, the insulating films 55a that constitute the sidewall insulating films 55 are formed simultaneously with the gate dielectric films 50. Therefore, the insulating films 55a are made of the same material as that of the gate dielectric films 50. On the other hand, the insulating films 55b are formed separately from the gate dielectric films 50. Therefore, the low-dielectric-constant films (so-called "Low-k films") can be used as the insulating films 55b.

Using the RIE method, the material of the insulating films 55b is then anisotropically etched until the upper surface of the source layer 30 is exposed. The material of the insulating films 55b on the source layer 30 and that on bottoms of the second trenches 70 are thereby removed. On the other hand, as shown in FIGS. 8B and 9, the insulating films 55a are left on inner sides of the second trenches 70, respectively. FIG. 9 is a perspective view of a structure at this stage. It can be readily understood that the sidewall insulating films 55 are formed to be thicker than the gate dielectric films 50 by referring to FIGS. 8B and 9.

Thereafter, a material of the source electrodes 80 is deposited in the second trenches 70 and on the source layer 30. For example, the source electrodes 80 are formed of a metal such as titanium or tungsten. Furthermore, the drain electrode 90 is formed on the opposite side of the semiconductor substrate 10 to the drift layer 20. The transistor 100 shown in FIGS. 1 and 2 is thus completed.

(Second Embodiment)

Figure 10:
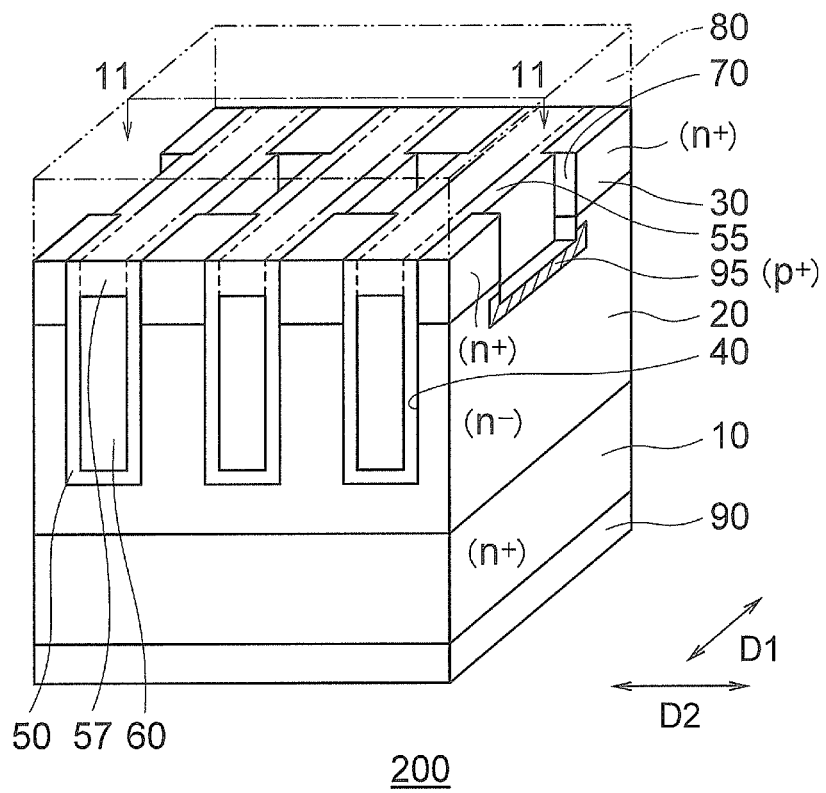
FIG. 10 is a perspective view showing an example of a configuration of a trench MISFET 200 according to a second embodiment.
Figure 11:
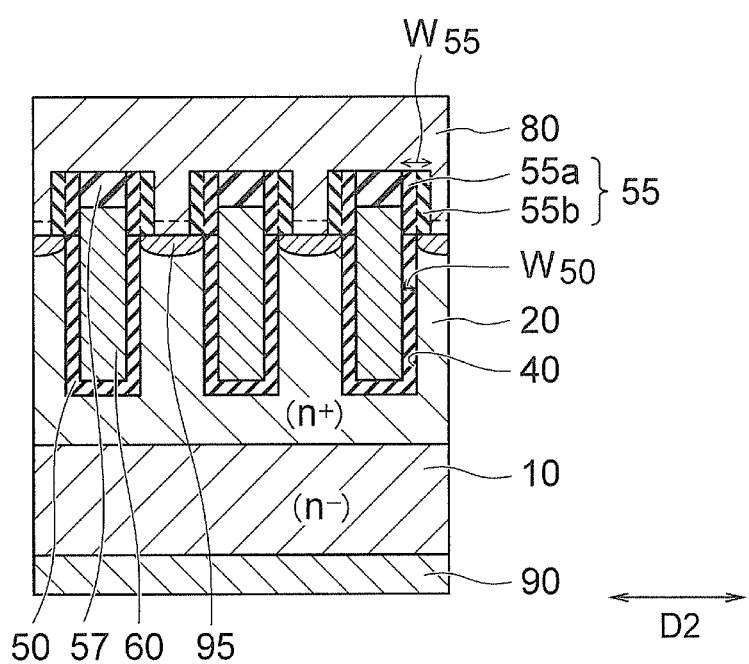
FIG. 11 is a cross-sectional view taken along a line 11-11 of FIG. 10.

FIG. 10 is a perspective view showing an example of a configuration of a trench MISFET 200 (hereinafter, also simply "transistor 200") according to a second embodiment. FIG.

11 is a cross-sectional view taken along a line 11-11 of FIG. 10. The transistor 200 further includes p+-carrier-emission diffusion layers 95, as compared with the transistor 100 according to the first embodiment. Other configuration of the transistor 200 can be the same as the corresponding configuration of the transistor 100.

The p+-carrier-emission diffusion layers 95 are provided between the source electrodes 80 and the drift layer 20, respectively. The p+-carrier-emission diffusion layers 95 are connected to the source electrodes 80 by a P-ohmic contact. That is, the source electrodes 80 are connected to not only the source layer 30 but also the drift layer 20 by the ohmic contact.

Figure 12:
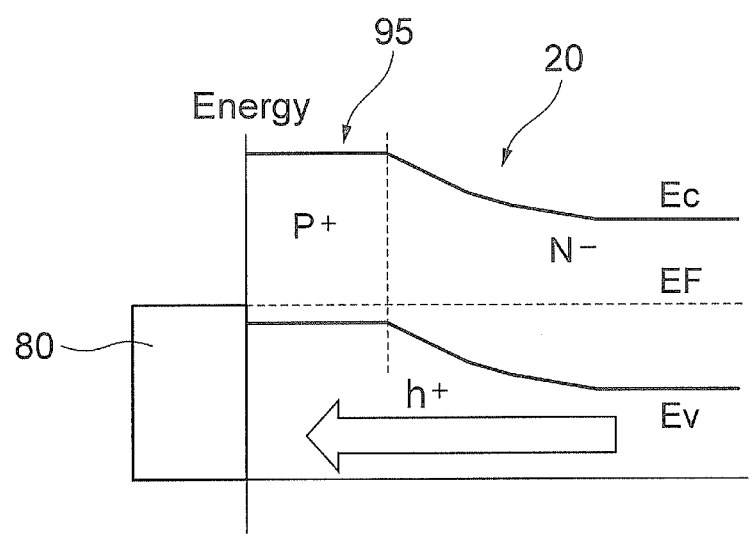
FIG. 12 is an energy band diagram showing the ohmic contact between one source electrode 80 and one carrier-emission diffusion layer 95.

FIG. 12 is an energy band diagram showing the ohmic contact between one source electrode 80 and one carrier-emission diffusion layer 95. In FIG. 12, reference characters Ec, Ev, and EF indicate energy of the lower end of the conduction band, energy of the upper end of the valence band, and Fermi energy, respectively. As can be understood from FIG. 12, a hole current forms a conduction path through the ohmic contact between the carrier-emission diffusion layer 95 and the source electrode 8.

A case of applying a voltage equal to or lower than the breakdown voltage between a source and a drain of the transistor 200 is considered. In this case, the avalanche breakdown, although it is weak, occurs in the drift layer 20 and electron-hole pairs are generated. By using a structure according to the second embodiment, the generated holes can be easily emitted from the source electrodes 80 and there is no possibility of a decrease in the breakdown voltage. On the other hand, the electrons flow in the direction of the drain electrode 90 similarly to the normal behavior and no problem occurs.

The carrier-emission diffusion layers 95 can be formed by implanting B or $BF_2$ as p-impurities into the bottoms of the second trenches 70 using an ion implantation technique after forming the second trenches 70 shown in FIG. 7. The other processes in a manufacturing method of the transistor 200 can be performed similarly to the corresponding processes in the manufacturing method of the transistor 100. The transistor 200 can be thereby manufactured.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first semiconductor layer of the first conduction type;
a second semiconductor layer of the first conduction type provided above the first semiconductor layer;
a plurality of gate electrodes respectively having one end located at the second semiconductor layer and other end located at the first semiconductor layer, the gate electrodes extending at a first direction;
a plurality of gate dielectric films respectively provided between the first semiconductor layer and the gate electrodes;
a plurality of first insulating films provided between the second semiconductor layer and the gate electrodes, respectively, the first insulating films being thicker than the gate dielectric film;
a first electrode provided at a shallower position than the other end between adjacent ones of the gate electrodes and contacting the first semiconductor layer, the second semiconductor layer and one of the first insulating films; and
a second electrode provided at an opposite side of the first semiconductor layer against to the second semiconductor layer.

2. The device of claim 1, wherein
the first insulating films respectively comprise:
a first partial insulating film as thick as the gate dielectric film; and
a second partial insulating film added to the first partial insulating film.

3. The device of claim 1, wherein the first electrode is connected to the first semiconductor layer by a Schottky contact.

4. The device of claim 2, wherein the first electrode is connected to the first semiconductor layer by a Schottky contact.

5. The device of claim 1, wherein the first electrode is connected to the second semiconductor layer by an ohmic contact.

6. The device of claim 2, wherein the first electrode is connected to the second semiconductor layer by an ohmic contact.

7. The device of claim 3, wherein the first electrode is connected to the second semiconductor layer by an ohmic contact.

8. The device of claim 2, wherein
the first partial insulating film includes a same material as a material of the gate dielectric film, and
the second partial insulating film includes a material lower at a dielectric constant than the gate dielectric film.

9. The device of claim 1, further comprising a diffusion layer of a second conduction type provided between the first electrode and the first semiconductor layer.

10. The device of claim 2, further comprising a diffusion layer of a second conduction type provided between the first electrode and the first semiconductor layer.

11. The device of claim 3, further comprising a diffusion layer of a second conduction type provided between the first electrode and the first semiconductor layer.

12. The device of claim 8, wherein the diffusion layer of the second conduction type is connected to the first electrode by an ohmic contact.

13. The device of claim 1, wherein
the gate electrodes are arrayed at a second direction intersecting with the first direction,
the first insulating films are provided above lateral parts of the gate electrodes, respectively, and
a plurality of the first electrodes are respectively provided on the side faces of the gate electrodes via the first insulating films.

14. The device of claim 2, wherein
the gate electrodes are arrayed at a second direction intersecting with the first direction,
the first insulating films are provided above lateral parts of the gate electrodes, respectively, and
a plurality of the first electrodes are respectively provided on the side faces of the gate electrodes via the first insulating films.

15. The device of claim 3, wherein
the gate electrodes are arrayed at a second direction intersecting with the first direction,
the first insulating films are provided above lateral parts of the gate electrodes, respectively, and
a plurality of the first electrodes are respectively provided on the side faces of the gate electrodes via the first insulating films.

16. The device of claim 1, wherein insulating films between the gate electrodes and the first electrode are thicker than insulating films between the gate electrodes and the first semiconductor layer or the second semiconductor layer.

17. A semiconductor device comprising:
a first semiconductor layer of the first conduction type;
a second semiconductor layer of the first conduction type provided above the first semiconductor layer;
a plurality of gate dielectric films respectively provided from a surface of the second semiconductor layer to a deep position reaching the first semiconductor layer, and provided above inner sides of a plurality of first trenches extending at a first direction;
a plurality of gate electrodes provided at the first trenches, respectively, with the gate dielectric film interposed therebetween;
a plurality of sidewall insulating films respectively provided above inner sides of a second trench on sides of the gate electrodes, the second trench being provided between adjacent ones of the first trenches and provided from the second semiconductor layer to a deep position reaching the first semiconductor layer, the sidewall insulating film being thicker than the gate dielectric film;
a first electrode provided at the second trench via one of the sidewall insulating film; and
a second electrode provided at an opposite side of the first semiconductor layer against to the second semiconductor layer.

18. The device of claim 17, wherein
the sidewall insulating films respectively comprise:
a first partial insulating film as thick as the gate dielectric film; and
a second partial insulating film added to the first partial insulating film.

19. The device of claim 17, wherein the first electrode is connected to the first semiconductor layer by a Schottky contact.

20. The device of claim 17, wherein the first electrode is connected to the second semiconductor layer by an ohmic contact.

* * * * *